US005444362A

United States Patent [19]

Chung et al.

[11] Patent Number: 5,444,362

[45] Date of Patent: Aug. 22, 1995

[54] DUAL BACK-BIAS VOLTAGE GENERATING CIRCUIT WITH SWITCHED OUTPUTS

[75] Inventors: Jin Y. Chung; Deog Y. Kwak, both of Seoul, Rep. of Korea

[73] Assignee: Goldstar Electron Co., Ltd., Cheongju, Rep. of Korea

[21] Appl. No.: 995,865

[22] Filed: Dec. 23, 1992

[30] Foreign Application Priority Data

Dec. 24, 1991 [KR] Rep. of Korea .................... 91-23693

[51] Int. Cl.[6] .......................... G05F 3/16; H03K 3/01

[52] U.S. Cl. .................................... 323/313; 327/536; 327/538

[58] Field of Search ..................... 323/313; 307/296.2, 307/296.6, 296.8, 246, 585

[56] References Cited

U.S. PATENT DOCUMENTS

| | | | |
|---|---|---|---|
| 4,740,715 | 4/1988 | Okada | 307/296 R |
| 4,810,952 | 3/1989 | Cohen | 323/300 |
| 4,961,007 | 10/1990 | Kumanoya et al. | 307/296.2 |
| 5,072,134 | 12/1991 | Min | 307/296.2 |
| 5,172,013 | 12/1992 | Matsumura | 307/296.2 |

*Primary Examiner*—A. D. Pellinen

*Assistant Examiner*—Y. J. Han

*Attorney, Agent, or Firm*—Alan R. Loudermilk

[57] ABSTRACT

A back-bias voltage generating circuit of a semiconductor device having a driving signal generating portion for receiving oscillating signals from an oscillator such as a ring oscillator and generating alternating high and low driving signals, a first pumping portion for charging the input driving signal at one electrode of a pumping capacitor so as to produce a voltage at the other electrode of the pumping capacitor lower than a back-bias voltage, a second pumping portion for charging another input driving signal at one electrode of a second pumping capacitor so as to produce a voltage at the other electrode of the second pumping capacitor lower than a back-bias voltage, a first switching portion being turned on by a voltage higher than a back-bias voltage and connecting the other electrode of the pumping capacitor to a back-bias voltage terminal when the voltage of this electrode is below the back-bias voltage, and a second switching portion being turned on by a voltage higher than a back-bias voltage and connecting the other electrode of the second pumping capacitor to a back-bias voltage terminal when the voltage of the second pumping portion is below the back-bias voltage.

15 Claims, 4 Drawing Sheets

DUAL BACK-BIAS VOLTAGE GENERATING CIRCUIT WITH SWITCHED OUTPUTS

BACKGROUND OF THE INVENTION

1. Field of the Invention

The present invention relates to voltage generating circuits of semiconductor devices, and more particularly to a back-bias voltage generating circuit for preventing electron injection into the substrate that is appropriate for a semiconductor device having CMOS transistors.

2. Description of the Prior Art

As illustrated in FIG. 1, a conventional back-bias generating circuit receives oscillating signals in the form of an alternate current waveform through inverter X4. The back-bias generating circuit also includes first pumping portion 100 having node N2, to which input driving signals are applied, and second pumping portion 200 having node N12, to which input driving signals are applied through inverter X5.

First pumping portion 100 includes PMOS transistor M1 coupled at its source to power source VCC and NMOS transistor M2, the gates of which are connected to node N2 and the drains of which are connected in common with each other and also connected to the gate of NMOS transistor M5, the source of which is grounded to ground terminal VSS. The drain of NMOS transistor M5 is connected through node N5 to the source of NMOS transistor M2. Inverters X1, X2 and X3 and pumping capacitor M4 are connected in series between nodes N2 and N5, forming nodes N6 to N8. NMOS transistor M3 has its drain connected to node N5. The gate and source of NMOS transistor M3 are connected together and to back-bias terminal VBB.

Second pumping portion 200 includes PMOS transistor M6, three NMOS transistors M7, M8 and M10, three inverters X6, X7 and X8, and pumping capacitor M9. Except for receiving input signals through inverter X5, these circuit elements are arranged in the same manner as with the circuit elements of first pumping portion 100.

Therefore, oscillation signal OSC is passed through inverter X4 to invert a high potential signal into a low potential signal, and vice versa. A low potential signal at node N2 is applied to the gates of PMOS transistor M1 and NMOS transistor M2, and PMOS transistor M1 is turned on, and NMOS transistor M2 is turned off. During the saturation condition of PMOS transistor M1, power source VCC causes NMOS transistor M5 to turn on.

At the same time, the low potential signal is inverted through three inverters X1, X2 and X3 into a high potential signal, and thus VCC is applied to one end of pumping capacitor M4. The other electrode of pumping capacitor M4 is connected to node N5, and thus VSS is applied to the other electrode.

Thereafter, oscillation signal OSC is reversed and passed through inverter X4 to invert the low potential signal into a high potential signal. The high potential signal at node N2 is applied to the gates of PMOS transistor M1 and NMOS transistor M2, and PMOS transistor M1 is turned off, and NMOS transistor M2 is turned on. Thus, NMOS transistor M5 turns off.

At the same time, the high potential signal of node N2 is inverted through three inverters X1, X2 and X3 into a low potential signal, and thus VSS is applied to one end of pumping capacitor M4. The other electrode of pumping capacitor M4 is connected to node N5 which is now in a floating state or connected to terminal VBB through transistor M3.

Pumping capacitor M4 has a coupling effect with the other electrode of the pumping capacitor, which becomes a negative voltage lower (more negative) than VSS.

Therefore, when the voltage difference between node N5 and back-bias terminal VBB approaches a threshold voltage, switching NMOS transistor M3 is turned on, and the voltage on back-bias terminal VBB may be lowered by the charge of the pumping capacitor.

Similarly, second pumping portion 200 is operated identically to first pumping portion 100, but the input driving signal is applied through inverter X5 to node N12, and the pumping signal opposite to that of pumping capacitor M4 is generated at pumping capacitor M9. First and second pumping portions 100 and 200 are pumped in turn in opposite phase to each other.

The conventional back-bias generating circuit causes the voltage values of common nodes N5 and N14 to be lowered in to a high degree over the back-bias voltage VBB. FIG. 4 is a waveform illustrating the voltages of VBB and node N5. During the time when the voltage of node N5 becomes lower than the voltage on terminal VBB, an increase in the number of electrons injected from the nodes of the pumping capacitors into the substrate may be caused, which thereby may result in abnormal operation of a cell such as latch-up.

Also, the applying of the back-bias voltage to a switching transistor requires substantial time for dropping the back-bias voltage by a desirous voltage because the conductance value of the switching transistor is small.

Accordingly, it is an object of the present invention to provide a back-bias voltage generating circuit of a semiconductor device for keeping a stable back-bias voltage at a predetermined level.

Another object of the present invention is to provide an inner voltage generating circuit of a semiconductor device for preventing electron injection into a substrate appropriate for a semiconductor device.

Another object of the present invention is to provide a back-bias voltage generating circuit of a semiconductor device for compensating the pumping voltage with respect to the back-bias voltage.

Still another object of the present invention is to provide a back-bias voltage generating circuit of a semiconductor device for enhancing the conduction property of a switching portion .with respect to the back-bias voltage.

SUMMARY OF THE INVENTION

In order to achieve these features and objects, the present invention comprises a driving signal generating portion for receiving oscillating signals from an oscillator such as a ring oscillator and generating the driving signals of a low signal and a high signal in turn; a first pumping portion for charging the input driving signal at one end of a pumping capacitor so as to achieve a voltage at the other end of the pumping capacitor that is lower than a back-bias voltage; a second pumping portion for charging another input driving signal at one end of a pumping capacitor so as to achieve a voltage at the other of the pumping capacitor that is lower than a back-bias voltage; a first switching portion that is turned on by a voltage higher than a back-bias voltage in order to be connected to a back-bias voltage terminal when the output of the first pumping portion is below the back-bias voltage; and a second switching portion for being turned on by a voltage higher than a back-bias voltage in order to be connected to a back-bias voltage terminal when the output of the second pumping portion is below the back-bias voltage.

BRIEF DESCRIPTION OF THE DRAWINGS

The present invention will now be explained in detail by reference to the accompanying drawings, in which.

DETAILED DESCRIPTION OF THE INVENTION

Figure 1:
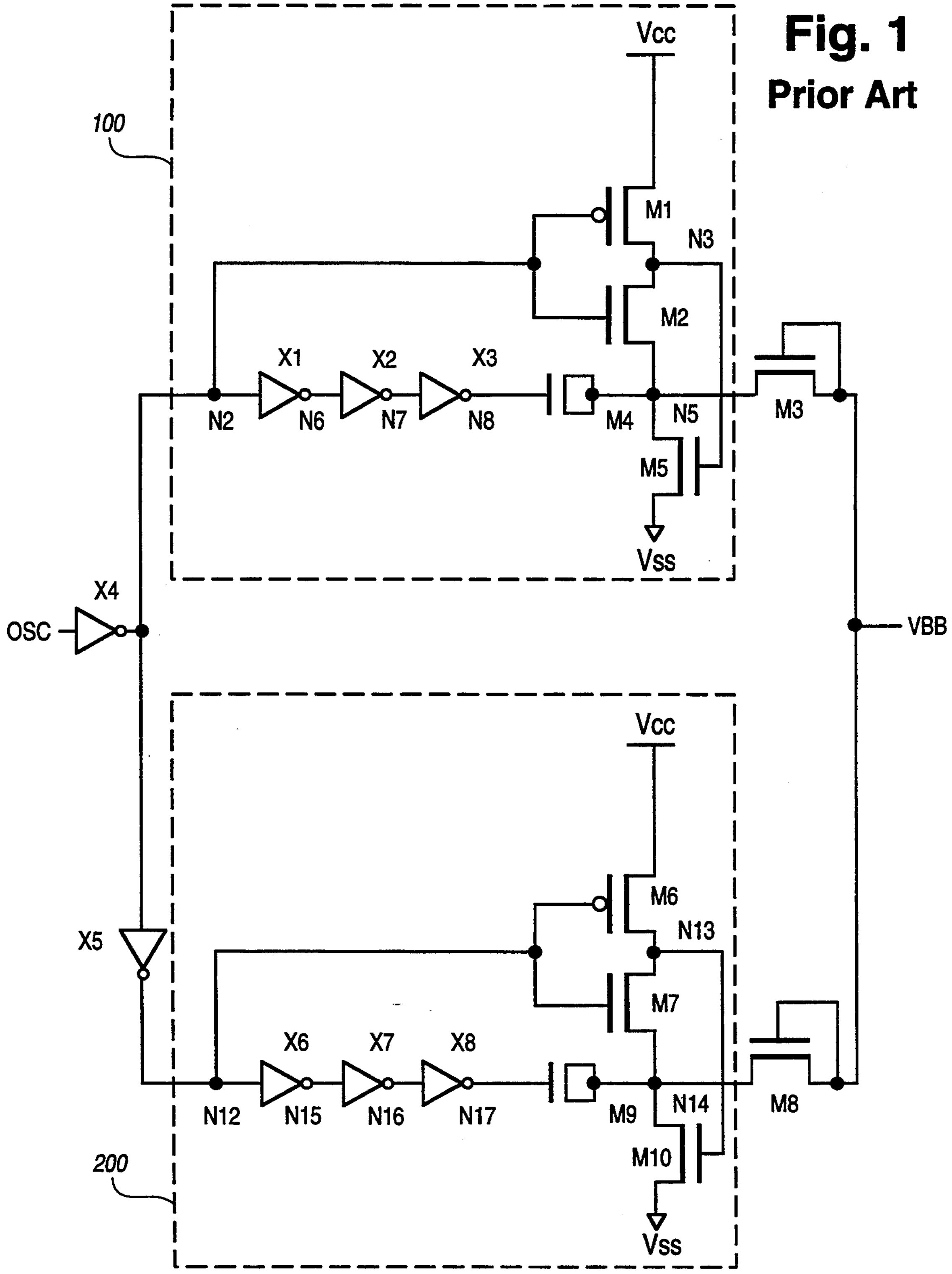
Fig. 1 Prior Art
FIG. 1 is a conventional back-bias voltage generating circuit of a semiconductor device having two pumping portions.
Figure 2:
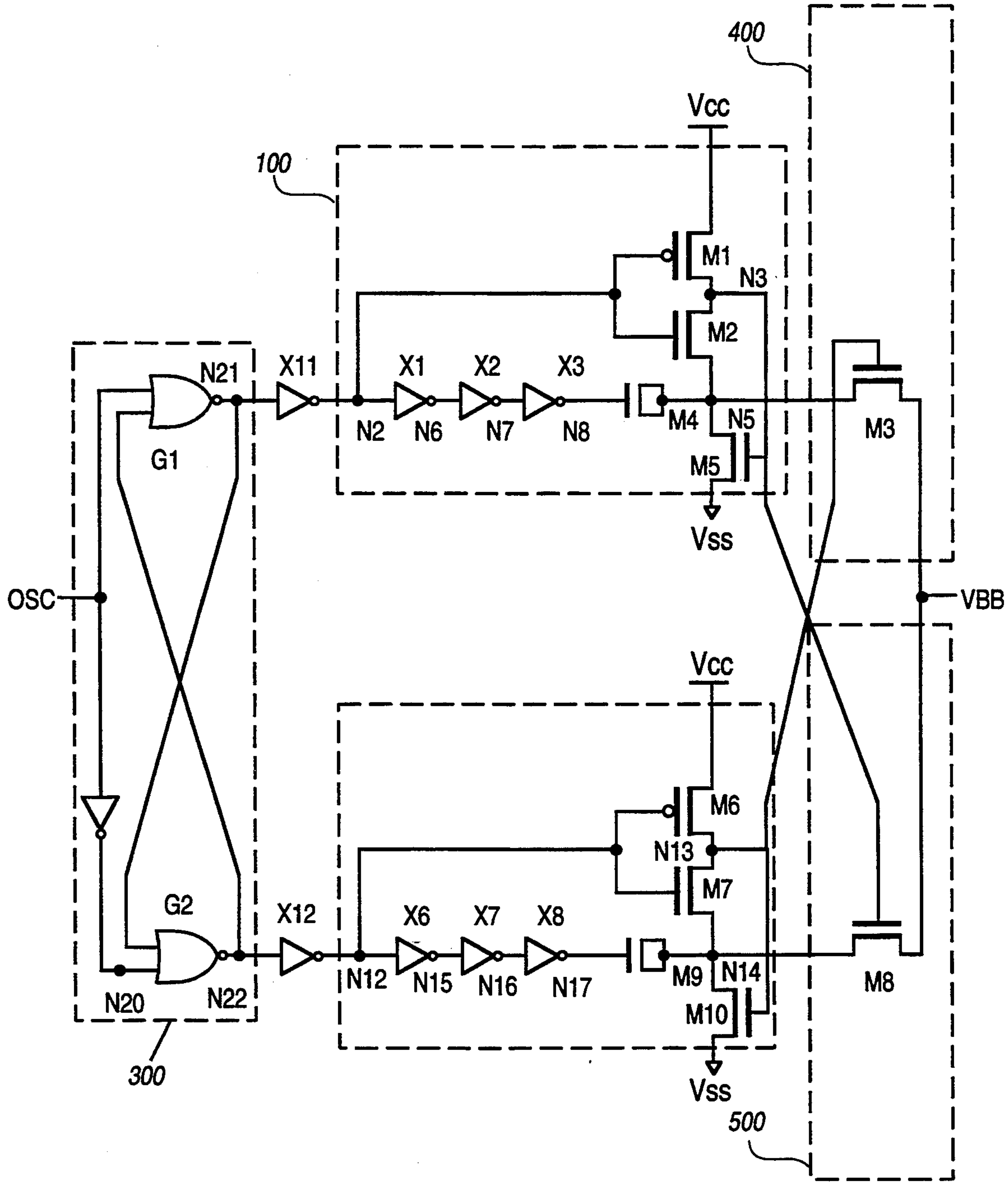
FIG. 2 is a back-bias voltage generating circuit of a semiconductor according to the present invention with reduced electron injection into the substrate.

FIG. 2 illustrates a back-bias voltage circuit of the present invention provided with first pumping portion 100 and second pumping portion 200, which are analogous to the pumping portions discussed with reference to FIG. 1, and a detailed discussion of these portions is omitted here.

The back-bias voltage circuit comprises driving signal generating portion 300 and two switching portions 400 and 500 arranged in the front and rear, respectively, of first and second pumping portions 100 and 200 as illustrated.

Figure 3A:
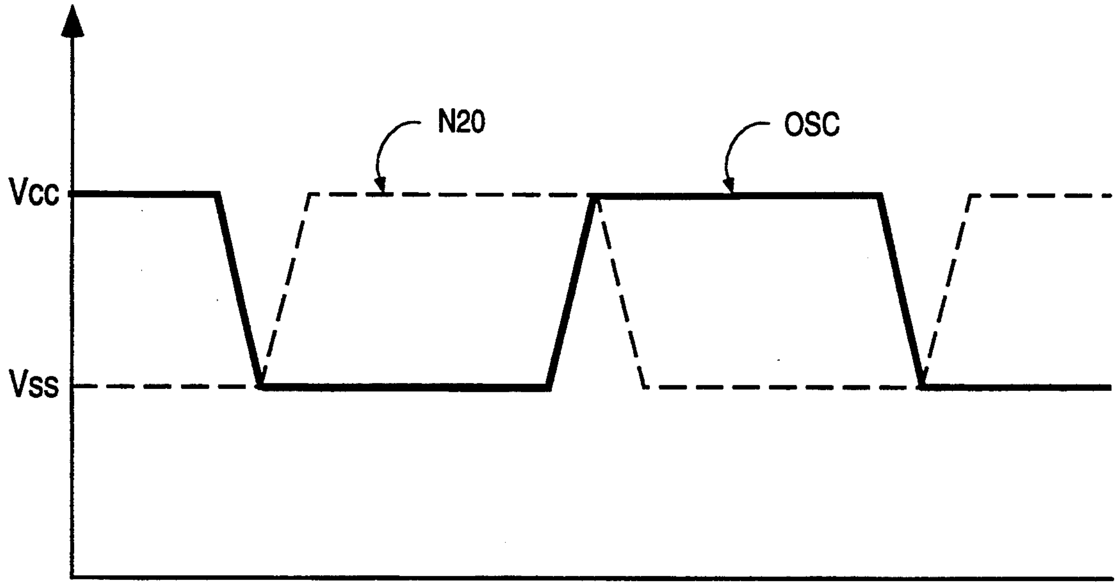
FIGS. 3A and 3B are waveform diagrams illustrating signals at various terminals/nodes with the present invention.
Figure 3B:
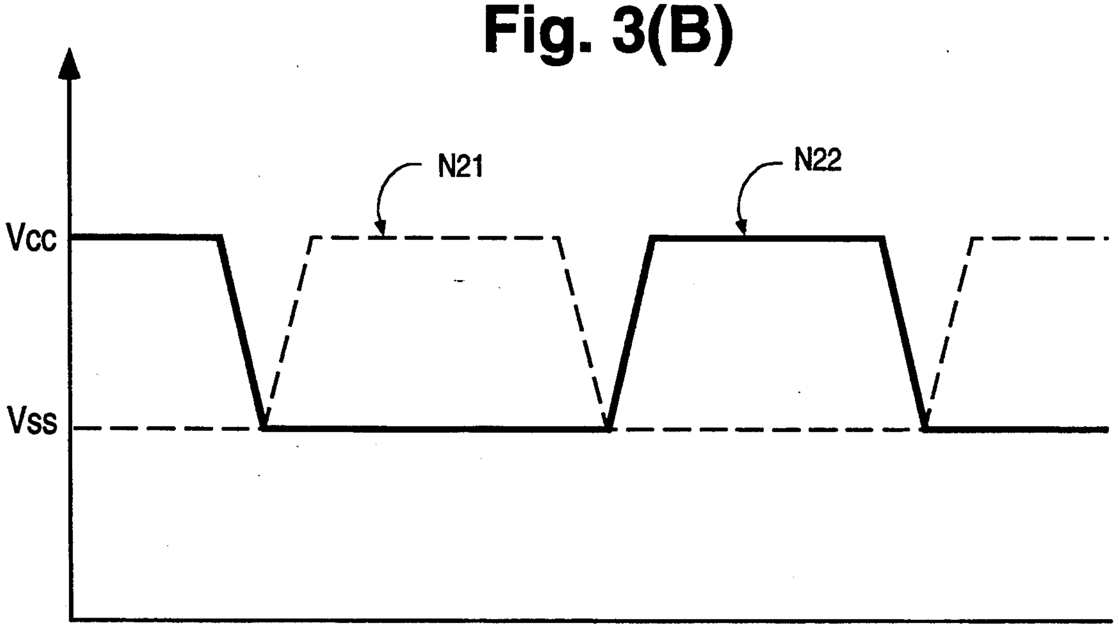

Driving signal generating portion 300 includes two NOR gates G1 and G2, each of the output terminals of which are coupled to an input terminal of the other in order to form a flip-flop configuration. Therefore, the oscillating signal as illustrated in FIG. 3A in the form of an alternate current wave is applied to one terminal of gate G1 and an inverter X10, simultaneously. The output at node N20, inverted by inverter X10, is applied to one terminal of gate G2. The outputs at node N21 and node N22 appear as "non-intermittent" square waves as illustrated in FIG. 3B.

First and second pumping portions 100 and 200 receive their input driving signals through inverters X11 and X12, respectively. The configurations of first and second pumping portions 100 and 200 are analogous to those of FIG. 1.

First switching portion 400 includes NMOS transistor M3, the gate of which is connected to the gate of NMOS transistor M10 in second pumping portion 200. Herein, the gate of NMOS transistor M10 is connected to node 13, which is the common connection point between PMOS transistor M6 and NMOS transistor M7 in second pumping portion 200.

Similarly, second switching portion 500 includes NMOS transistor M8, the gate of which is connected to the gate of NMOS transistor M5 in first pumping portion 100. Herein, the gate of NMOS transistor M5 is connected to node 3, which is the common connection point between PMOS transistor M1,and NMOS transistor M2 in first pumping portion 100.

The driving signal generating portion 300 operates as follows. When the oscillating signal is lowered from a high level to a low level, the signal at node N20 is inverted passing through inverter X10, and subsequently the signal at node N22 becomes a low level. Thereafter, NOR gate G1 outputs a high level signal at node N21. On the contrary, when the oscillating signal is raised from a low level to a high level, the signal at node N21 becomes a low level, and thereafter the signal at node N22 passed through NOR gate G2 becomes a high level. As a result, the signals at nodes N21 and N22 can avoid overlapping at the high level as illustrated in FIGS. 3A and 3B.

The signals at nodes N21 and N22 are input driving signals with respect to each of pumping portions 100 and 200, and are passed through inverters X11 and X12 to invert the input driving signals.

A low level signal at node N2 is applied to the gates of PMOS and NMOS transistors M1 and M2, and PMOS transistor M1 is turned on, and NMOS transistor M2 is turned off. During the saturation condition of PMOS transistor M1, the power source VCC causes NMOS transistor M5 to turn on, and thus node N5 is maintained at the VSS voltage level.

At the same time, the low level signal is inverted through three inverters X1, X2 and X3 into a high level signal that is applied to one end of pumping capacitor M4. Therefore, the voltage between the two electrodes of pumping capacitor M4 increases to a voltage of VCC. That is, the one end of pumping capacitor M4 is charged with VCC, and the common node N5 is at ground level VSS.

Thereafter, the input driving signal changes from the low level signal to the high level signal, or vice versa.

The high level signal at node N2 is applied to the gates of PMOS and NMOS transistors M1 and M2, and PMOS transistor M1 is turned off, and NMOS transistor M2 is turned on. Thus, NMOS transistor M5 turns off, and node N5 assumes a floating state.

At the same time, the high level signal of node N2 is inverted through three inverters X1, X2 and X3 into a low level signal, and thus VSS is applied to one electrode of pumping capacitor M4. The other electrode of pumping capacitor M4 is connected to node N5, which is now in a floating state.

Due to the coupling effect of pumping capacitor M4, the voltage of the electrode of pumping capacitor M4 connected to node N5 becomes a negative voltage below VSS (negative with respect to VSS).

On the other hand, at this moment, node N12 is in a low level state, and this low level signal is applied to PMOS and NMOS transistors M6 and M7, and PMOS transistor M6 is turned on, and NMOS transistor M7 is turned off, and thus node N13 is at a voltage level of VCC. Thus, transistor M3 turns on by the voltage level of node N13, and the other electrode of pumping capacitor M4 connected to node N5 is connected to the VBB terminal through transistor M3.

At same time, the low level signal of node N12 is applied to PMOS and NMOS transistors M6 and M7, and PMOS transistor M6 turns on, and NMOS transistor M7 turns off, and NMOS transistor M10 is turned on. The low level signal is inverted through three inverters X6, X7 and X8 into a high level signal applied to one end of pumping capacitor M9. The other end of pumping capacitor M9 is connected to VSS through transistor M10, and transistor M8 is turned off due to the low voltage level of node N3. Thus, node N14 is maintained at a voltage level of VSS, and the voltage of node N17 increases to the voltage level of VCC, and electrons at node N14 drift to the ground terminal VSS.

Next, when the oscillating signal is reversed into the high level, switching NMOS transistors M3 and M8 are operated opposite to that of the above description. As a result, first and second pumping portions 100 and 200 cause switching NMOS transistors M3 and M8 to be pumped in turn.

Figure 5:
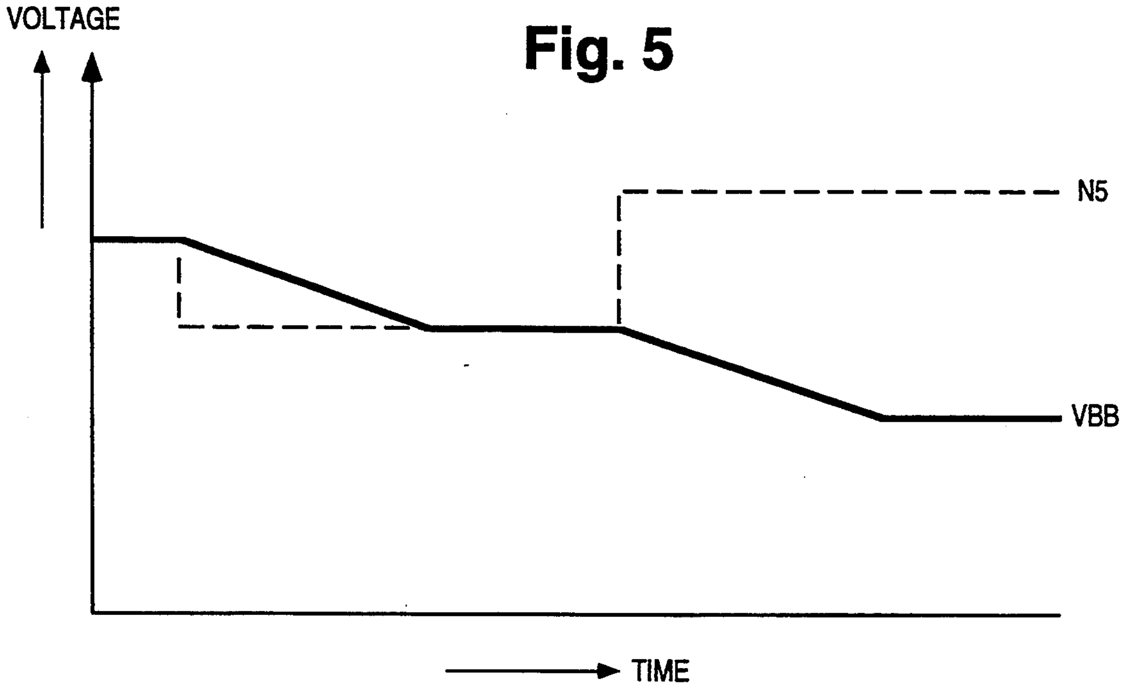

Herein, it is noted that one of the switching NMOS transistors is turned off to form the pumping portion, and the other switching NMOS transistor is turned on to have the higher conductance. In other words, according to the output voltage of a ring oscillator, the back-bias voltage and a power source are applied in turn to one of the gates of the switching NMOS transistors, thereby remarkably enhancing the pumping efficiency. FIG. 5 is a waveform diagram illustrating the voltage of node N5 and back-bias terminal VBB according to the present invention.

Figure 4:
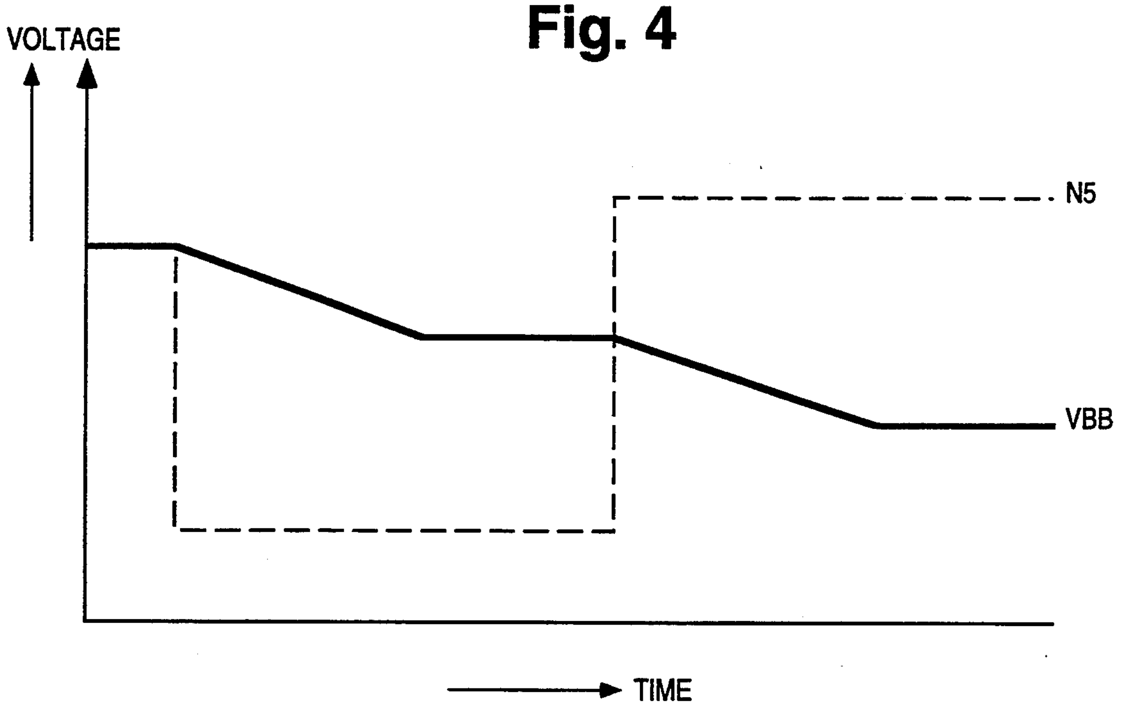
FIG. 4 is a waveform diagram illustrating the relationship between the voltage on a node of a pumping portion and the voltage on a back-bias terminal according to a conventional circuit; and, FIG. 5 is a waveform diagram illustrating the relationship between the voltage on a node of a pumping portion and the voltage on a back-bias terminal in accordance with the present invention.

Also, as illustrated in FIG. 4, with the conventional back-bias voltage generating circuits discussed above, a problem may arise in that electrons are injected from the electrode of the pumping capacitor into the substrate due to the voltage of node N5 being lower than the voltage VBB. But, as illustrated in FIG. 5, with the present invention, when the voltage at one end of the pumping capacitor is being lowered below the voltage of the back-bias terminal, the voltage is applied through the switching NMOS transistor to the back-bias terminal because the switching NMOS transistor is turned on by a voltage level of VCC, thereby preventing electron injection from the junction of the pumping capacitors into the substrate.

Furthermore, as shown in FIG. 2, the signals at nodes N21 and N22 are not simultaneously made into a high level, and the signals at nodes N5 and N14 do not simultaneously become a high level. With the present invention, it is very easy to prevent the reversing flow of currents from the back-bias terminal VBB into nodes N5 and N14.

Accordingly, the present invention has a voltage lower than a back-bias voltage for a short period, but is kept at a voltage identical to or higher than the back-bias voltage to increase the pumping efficiency.

Although various preferred embodiments of the present invention have been disclosed for illustrative purposes, those skilled in the art will appreciate that various modifications, additions and/or substitutions are possible without departing from the scope and spirit of the present invention as disclosed in the claims.

What is claimed is:

1. A back-bias voltage generating circuit of a semiconductor device for applying a back-bias voltage to a back-bias terminal and for lowering the voltage of the back-bias terminal, comprising:

a driving signal generating circuit receiving oscillating signals from an oscillator, the driving signal generating circuit generating first and second input driving signals of alternating low and high levels;

a first pumping circuit coupled to receive the first input driving signal and having a first pumping capacitor, the first pumping circuit charging a first electrode of the first pumping capacitor, wherein a second electrode of the first pumping capacitor is charged to a voltage lower than the voltage of the back-bias terminal;

a second pumping circuit coupled to receive the second input driving signal and having a second pumping capacitor, the second pumping circuit charging a first electrode of the second pumping capacitor, wherein a second electrode of the second pumping capacitor is charged to a voltage lower than the voltage of the back-bias terminal;

a first switching circuit coupled to the second pumping circuit and responsive to a signal received from the second pumping circuit of a voltage level higher than the voltage of the back-bias terminal, wherein the second electrode of the first pumping capacitor is coupled by the first switching circuit to the back-bias terminal during the time when the voltage on the second electrode of the first pumping capacitor is lower than the voltage of the back-bias terminal; and a second switching circuit coupled to the first pumping circuit and responsive to a signal received from the first pumping circuit of a voltage level higher than the voltage of the back-bias terminal, wherein the second electrode of the second pumping capacitor is coupled by the second switching circuit to the back-bias terminal during the time when the voltage on the second electrode of the second pumping capacitor is lower than the voltage of the back-bias terminal.

2. The back-bias voltage generating circuit as claimed in claim 1, wherein:

the driving signal generating circuit comprises first and second NOR gates, the output of the first NOR gate being coupled to a first input terminal of the second NOR gate and the output of the second NOR gate being coupled to a first input terminal of the first NOR gate, a second input terminal of the first NOR gate being coupled to receive an oscillating signal from the oscillator, a second input terminal of the second NOR gate being coupled to receive the output of an inverter, wherein the input of the inverter is coupled to receive the oscillating signal from the oscillator, wherein the outputs of the first and second NOR gates generate first and second input driving signals that are substantially non-overlapping alternating signals.

3. The back-bias voltage generating circuit as claimed in claim 1, wherein:

the first pumping circuit comprises a first NMOS transistor operative to ground the second electrode of the first pumping capacitor when the first electrode of the first pumping capacitor is being charged;

the second pumping circuit comprises a second NMOS transistor operative to ground the second electrode of the second pumping capacitor when the first electrode of the second pumping capacitor is being charged;

the first switching circuit comprises a third NMOS transistor having a gate coupled to the second NMOS transistor of the second pumping circuit;

the second switching circuit comprises a fourth NMOS transistor having a gate coupled to the first NMOS transistor of the first pumping circuit;

wherein the third and fourth NMOS transistors are operative to couple and decouple the second electrodes of the first and second pumping capacitors, respectively, to the back-bias terminal in a manner such that the voltage applied to the gates of the third and fourth NMOS transistors, respectively, is less than the voltage of the back-bias terminal during the time when the third and fourth transistors, respectively, are being turned off, wherein reversing current flow from the back-bias terminal to the second electrodes of the first and second pumping capacitors is prevented during turn off of the third and fourth NMOS transistors, respectively, and wherein the third and fourth NMOS transistors are operated in a high conductance state during the time when the second electrodes of the first and second pumping capacitors, respectively, are coupled to the back-bias terminal.

4. A voltage generating circuit for applying a voltage to a terminal, comprising:

oscillator means for generating alternating first and second oscillating signals of alternating high and low voltage levels:

a first pumping capacitor circuit coupled to receive first oscillating signal and including a first pumping capacitor having first and second electrodes, the first electrode of the first pumping capacitor being coupled to receive input signals derived from the first oscillating signal;

a second pumping capacitor circuit coupled to receive the second oscillating signal and including a second pumping capacitor having first and second electrodes, the first electrode of the second pumping capacitor being coupled to receive input signals derived from the second oscillating signal;

first switch means coupled to the first pumping capacitor and the second pumping circuit for selectively coupling and decoupling the second electrode of the first pumping capacitor to the terminal, the first switch means being operative in response to signals derived from the second oscillating signal; and second switch means coupled to the second pumping capacitor and the first pumping circuit for selectively coupling and decoupling the second electrode of the second pumping capacitor to the terminal, the second switch means being operative in response to signals derived from the first oscillating signal.

5. The circuit as claimed in claim 4, wherein the first and second oscillating signals are substantially non-overlapping.

6. The circuit as claimed in claim 4, wherein the terminal has a back-bias voltage, wherein the first and second switch means couple the second electrodes of the first and second pumping capacitors to the terminal, respectively, in response to a high voltage level signal, and wherein the first and second switch means decouple the second electrodes of the first and second pumping capacitors to the terminal, respectively, in response to a signal having a voltage level lower than the back-bias voltage.

7. The circuit as claimed in claim 4, wherein the terminal has a back-bias voltage, wherein the first switch means comprises a first NMOS transistor and the second switch means comprises a second NMOS transistor, the first and second NMOS transistors each having a gate to which is applied a signal for selectively coupling and decoupling the second electrode of the first and second pumping capacitors, respectively, to the terminal, wherein the first and second NMOS transistors couple the second electrodes of the first and second pumping capacitors to the terminal, respectively, in response to a high voltage level signal applied to the gates thereof, and wherein the first and second NMOS transistor decouple the second electrodes of the first and second pumping capacitors from the terminal, respectively, in response to a voltage level lower than the back-bias voltage.

8. A back-bias voltage generating circuit of a semiconductor device for applying a back-bias voltage to a back-bias terminal, comprising:

a driving signal generating circuit receiving oscillating signals from an oscillator, the driving signal generating circuit generating first and second input driving signals of alternating low and high levels;

a first pumping circuit coupled to receive the first input driving signal and having a first pumping capacitor, the first pumping circuit charging a first electrode of the first pumping capacitor, wherein a second electrode of the first pumping capacitor is charged to a voltage lower than the voltage of the back-bias terminal, the first pumping circuit also generating a second switch means control signal;

a second pumping circuit coupled to receive the second input driving signal and having a second pumping capacitor, the second pumping circuit charging a first electrode of the second pumping capacitor, wherein a second electrode of the second pumping capacitor is charged to a voltage lower than the voltage of the back-bias terminal, the second pumping circuit also generating a first switch means control signal;

a first switching means responsive to the first switch means control signal generated by the second pumping circuit for coupling the second electrode of the first pumping capacitor to the back-bias terminal during a time when the voltage on the second electrode of the first pumping capacitor is lower than the voltage of the back-bias terminal and for decoupling the second electrode of the first pumping capacitor from the back-bias terminal; and a second switching means responsive to the second switch means control signal generated by the first pumping circuit for coupling the second electrode of the second pumping capacitor to the back-bias terminal during a time when the voltage on the second electrode of the second pumping capacitor is lower than the voltage of the back-bias terminal and for decoupling the second electrode of the second pumping capacitor from the back-bias terminal.

9. The circuit as claimed in claim 8, wherein the first switching means comprises a first NMOS transistor and the second switching means comprises a second NMOS transistor, wherein the first pumping circuit comprises first PMOS transistor and third and fourth NMOS transistors connected in series between first and second power terminals, the source of the first PMOS transistor coupled to the first power terminal, and the drains of the first PMOS transistor and the third NMOS transistor coupled together and coupled to the gates of the second and fourth NMOS transistors, the source of the third NMOS transistor coupled to the drain of the fourth NMOS transistor and to the second electrode of the first pumping capacitor, the source of the fourth NMOS transistor coupled to the second power terminal.

10. The circuit as claimed in claim 9, wherein the second pumping circuit comprises second PMOS transistor and firth and sixth NMOS transistors connected in series between the first and second power terminals, the source of the second PMOS transistor coupled to the first power terminal, and the drains of the second PMOS transistor and the firth NMOS transistor coupled together and coupled to the gates of the first and sixth NMOS transistors, the source of the fifth NMOS transistor coupled to the drain of the sixth NMOS transistor and to the second electrode of the second pumping capacitor, the source of the sixth NMOS transistor coupled to the second power terminal.

11. The circuit as claimed in claim 10, further comprising first inverter means for inverting the first input driving signal, and second inverter means for inverting the second input driving signal, wherein the first input driving signal is applied to the gates of the first PMOS transistor and the third NMOS transistor and the inverted first input driving signal is applied to the first electrode of the first pumping capacitor, and wherein the second input driving signal is applied to the gates of the second PMOS transistor and the fifth NMOS transistor and the inverted second input driving signal is applied to the first electrode of the second pumping capacitor.

12. The circuit as claimed in claim 11, wherein the first and second input driving signals are substantially non-overlapping.

13. The circuit as claimed in claim 9, wherein the first and second input driving signals are substantially non-overlapping.

14. The circuit as claimed in claim 10, wherein the first and second input driving signals are substantially non-overlapping.

15. The circuit as claimed in claim 8, wherein the first and second input driving signals are substantially non-overlapping.

* * * * *